US012652022B2

(12) United States Patent
Okada et al.

(10) Patent No.: US 12,652,022 B2
(45) Date of Patent: Jun. 9, 2026

(54) FILTER DEVICE

(71) Applicant: Murata Manufacturing Co., Ltd.,
Nagaokakyo (JP)

(72) Inventors: Takuro Okada, Nagaokakyo (JP);
Hideki Iwamoto, Nagaokakyo (JP);
Kentaro Nakamura, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 214 days.

(21) Appl. No.: 18/420,915

(22) Filed: Jan. 24, 2024

(65) Prior Publication Data

US 2024/0243728 A1     Jul. 18, 2024

Related U.S. Application Data

(63) Continuation of application No.
PCT/JP2022/035203, filed on Sep. 21, 2022.

(30) Foreign Application Priority Data

Sep. 24, 2021     (JP) ................................. 2021-155610

(51) Int. Cl.
| | |
|---|---|
| *H03H 9/64* | (2006.01) |
| *H03H 9/02* | (2006.01) |
| *H03H 9/145* | (2006.01) |

(52) U.S. Cl.
CPC ...... *H03H 9/6453* (2013.01); *H03H 9/02559*
(2013.01); *H03H 9/02637* (2013.01);
(Continued)

(58) Field of Classification Search
CPC ............. H03H 9/6453; H03H 9/02559; H03H
9/02637; H03H 9/02866; H03H 9/145;
(Continued)

(56) References Cited

U.S. PATENT DOCUMENTS

| | | | |
|---|---|---|---|
| 2006/0076852 A1* | 4/2006 | Ruile | H03H 9/02228 |
| | | | 310/313 R |
| 2008/0238572 A1* | 10/2008 | Funami | H03H 9/6483 |
| | | | 333/133 |

(Continued)

FOREIGN PATENT DOCUMENTS

| | | |
|---|---|---|
| JP | 2002141768 A | 5/2002 |
| JP | 2018506930 A | 3/2018 |

(Continued)

OTHER PUBLICATIONS

International Search Report in PCT/JP2022/035203, mailed Nov.
29, 2022, 4 pages.

(Continued)

*Primary Examiner* — John W Poos
(74) *Attorney, Agent, or Firm* — Keating & Bennett, LLP

(57) ABSTRACT

A filter device includes at least one first acoustic wave
resonator and at least one second acoustic wave resonator.
The at least one first acoustic wave resonator includes a first
piezoelectric substrate and first and second IDT electrodes.
The first piezoelectric substrate includes a piezoelectric
layer with first and second main surfaces facing each other.
The first IDT electrode is on the first main surface. The
second IDT electrode is on the second main surface and
faces the first IDT electrode. The at least one second acoustic
wave resonator includes a second piezoelectric substrate and
a third IDT electrode. The second piezoelectric substrate
includes a piezoelectric layer with third and fourth main
surfaces facing each other. The third IDT electrode is on one
of the third and fourth main surfaces.

39 Claims, 8 Drawing Sheets

(52) U.S. Cl.
CPC ........ *H03H 9/02866* (2013.01); *H03H 9/145*
(2013.01); *H03H 9/6483* (2013.01)

(58) Field of Classification Search
CPC ........ H03H 9/6483; H03H 9/64; H03H 9/725;
H03H 9/25
See application file for complete search history.

(56) References Cited

U.S. PATENT DOCUMENTS

| | | | | |
|---|---|---|---|---|
| 2010/0327995 | A1* | 12/2010 | Reinhardt | H03H 3/04 |
| | | | | 333/195 |
| 2011/0095845 | A1 | 4/2011 | Fujiwara et al. | |
| 2016/0182007 | A1 | 6/2016 | Bhattacharjee | |
| 2019/0319603 | A1 | 10/2019 | Kadota et al. | |
| 2020/0028487 | A1* | 1/2020 | Caron | H03H 9/02228 |
| 2021/0297060 | A1 | 9/2021 | Omura et al. | |
| 2022/0216853 | A1 | 7/2022 | Taniguchi et al. | |

FOREIGN PATENT DOCUMENTS

| | | |
|---|---|---|
| JP | 2020022160 A | 2/2020 |
| JP | 2020182137 A | 11/2020 |
| JP | 2021044835 A | 3/2021 |
| WO | 2009147787 A1 | 12/2009 |
| WO | 2018097016 A1 | 5/2018 |
| WO | 2020116528 A1 | 6/2020 |
| WO | 2021060150 A1 | 4/2021 |

OTHER PUBLICATIONS

Written Opinion in PCT/JP2022/035203, mailed Nov. 29, 2022, 7 pages.

\* cited by examiner

FILTER DEVICE

CROSS REFERENCE TO RELATED APPLICATIONS

This application claims the benefit of priority to Japanese Patent Application No. 2021-155610 filed on Sep. 24, 2021 and is a Continuation Application of PCT Application No. PCT/JP2022/035203 filed on Sep. 21, 2022. The entire contents of each application are hereby incorporated herein by reference.

BACKGROUND OF THE INVENTION

1. Field of the Invention

The present invention relates to filter devices including multiple acoustic wave resonators.

2. Description of the Related Art

Hitherto, a filter device including multiple acoustic wave resonators is widely used for mobile phones, for example. Japanese Unexamined Patent Application Publication No. 2018-506930 discloses an example of a MEMS (Micro-electrical-mechanical system) waveguide device as an acoustic wave resonator. In this acoustic wave resonator, an IDT (Interdigital Transducer) is provided on each of the main surfaces of a single-crystal piezoelectric layer. A slow wave propagation layer and a single-side wave trapping structure are stacked on each of the main surfaces of the single-crystal piezoelectric layer. Each IDT is embedded in the corresponding slow wave propagation layer.

Providing an IDT on both of the main surfaces of a single-crystal piezoelectric layer can enhance the miniaturization of an acoustic wave resonator and a filter device. In the acoustic wave resonator disclosed in Japanese Unexamined Patent Application Publication No. 2018-506930, however, in response to the input of electric power, a stress is applied to a portion of the single-crystal piezoelectric layer sandwiched by the two IDTs, thus locally concentrating a stress on this portion of the single-crystal piezoelectric layer. Additionally, heat accumulates in this portion, which is likely to cause a temperature rise. This may lead to the degradation of the filter characteristics.

SUMMARY OF THE INVENTION

Example embodiments of the present invention provide filter devices that are each reduced in size and able to reduce or prevent degradation of filter characteristics.

A filter device according to an example embodiment of the present invention includes at least one first acoustic wave resonator and at least one second acoustic wave resonator. The at least one first acoustic wave resonator includes a piezoelectric substrate and first and second IDT electrodes. The piezoelectric substrate includes a piezoelectric layer including first and second main surfaces facing each other. The first IDT electrode is provided on the first main surface. The second IDT electrode is provided on the second main surface and faces the first IDT electrode. The at least one second acoustic wave resonator includes a piezoelectric substrate and a third IDT electrode. The piezoelectric substrate of the at least one second acoustic wave resonator includes a piezoelectric layer including third and fourth main surfaces facing each other. The third IDT electrode is provided on one of the third and fourth main surfaces.

Filter devices according to example embodiments of the present invention improve the miniaturization of the filter device and reduce or prevent the degradation of the filter characteristics.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be explained below with reference to the drawings through illustration of example embodiments of the present invention.

The individual example embodiments disclosed in the specification are only examples. The configurations described in different example embodiments may be partially replaced by or combined with each other.

Figure 1:
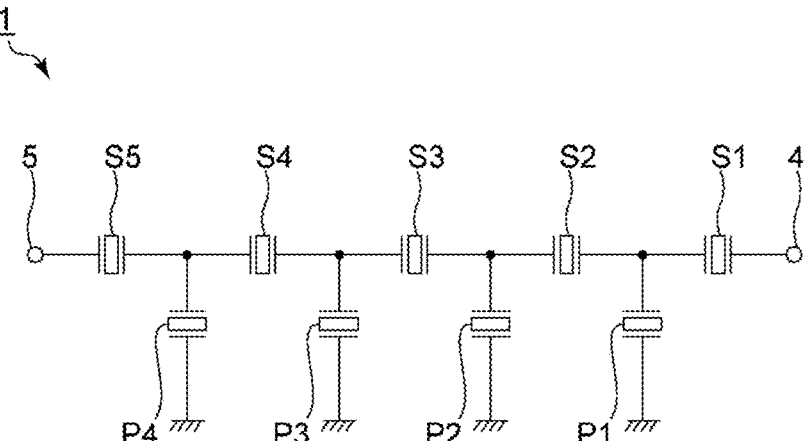
FIG. 1 is a circuit diagram of a filter device according to a first example embodiment of the present invention.

FIG. 1 is a circuit diagram of a filter device according to a first example embodiment of the present invention.

A filter device 1 of the first example embodiment is a ladder filter, for example. The filter device 1 includes a first signal terminal 4, a second signal terminal 5, plural series arm resonators, and plural parallel arm resonators. In the first example embodiment, the first signal terminal 4 is an input terminal. A signal is input from a signal terminal. The second signal terminal 5 is an antenna terminal. The antenna terminal is connected to an antenna. The first and second signal terminals 4 and 5 may be defined by electrode pads or by wiring patterns, for example. The filter device 1 is a transmit filter, for example. The filter device 1 may alternatively be a receive filter, for example, in which case, the first signal terminal 4 may be an output terminal.

In the filter device 1, all of the series arm resonators and all of the parallel arm resonators are acoustic wave resonators, for example. More specifically, the filter device 1 includes first and second acoustic wave resonators. In the first example embodiment, all of the series arm resonators are the first acoustic wave resonators, while all of the parallel arm resonators are the second acoustic wave resonators. However, a series arm resonator may be the second acoustic wave resonator, and a parallel arm resonator may be the first acoustic wave resonator. That is, in the filter device 1 basically defined by the first acoustic wave resonators, at least one acoustic wave resonator is the second acoustic wave resonator. Hereinafter, the specific configurations of the first and second acoustic wave resonators will be described below.

Figure 2:
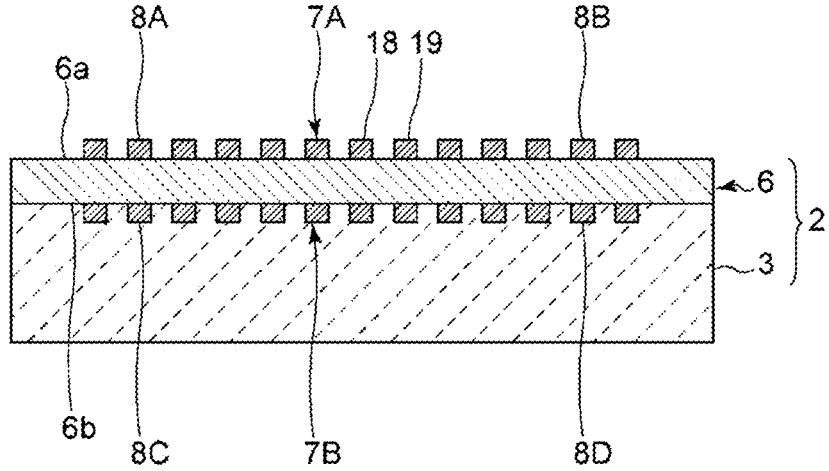
FIG. 2 is an elevational cross-sectional view of a first acoustic wave resonator in the first example embodiment of the present invention.
Figure 3:
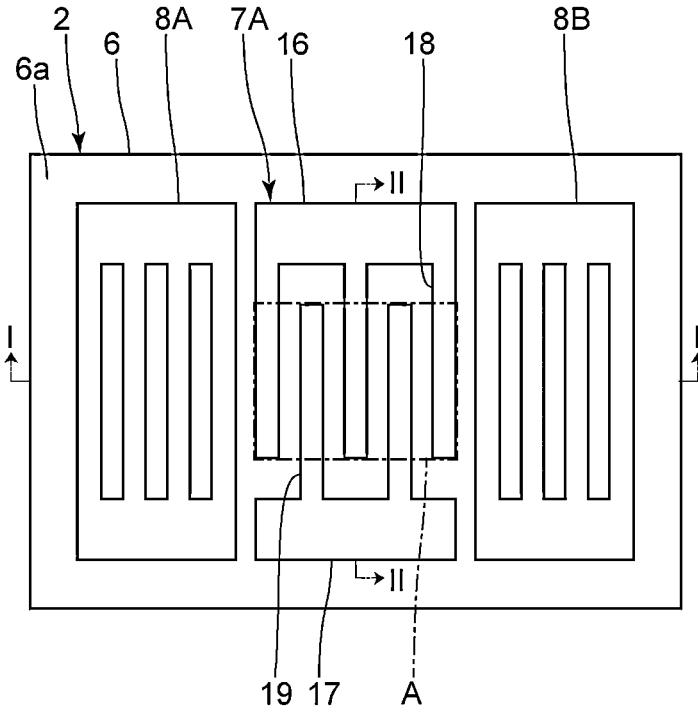
FIG. 3 is a plan view of the first acoustic wave resonator in the first example embodiment of the present invention.

FIG. 2 is an elevational cross-sectional view of the first acoustic wave resonator in the first example embodiment. FIG. 3 is a plan view of the first acoustic wave resonator in the first example embodiment. FIG. 2 is a sectional view taken along line I-I in FIG. 3.

As shown in FIG. 2, the first acoustic wave resonator includes a piezoelectric substrate 2. The piezoelectric substrate 2 includes a support substrate 3 and a piezoelectric layer 6. The multilayer structure of the piezoelectric substrate 2 is not limited to this configuration. The piezoelectric layer 6 includes a first main surface 6a and a second main surface 6b. The first and second main surfaces 6a and 6b face each other.

A first IDT electrode 7A is disposed on the first main surface 6a of the piezoelectric layer 6. A second IDT electrode 7B is disposed on the second main surface 6b. The first and second IDT electrodes 7A and 7B face each other with the piezoelectric layer 6 interposed therebetween. A protection film, such as a silicon oxide film, for example, may be provided on the first main surface 6a to cover the first IDT electrode 7A.

The second main surface 6b of the piezoelectric layer 6 is bonded to the support substrate 3, which defines and functions as a support. More specifically, the piezoelectric layer 6 is disposed directly on the support substrate 3. The second IDT electrode 7B is embedded in the support substrate 3. In other words, the support substrate 3 includes a portion facing the second IDT electrode 7B. This can stabilize the electrical characteristics of the first acoustic wave resonator.

With the application of an AC voltage to the first and second IDT electrodes 7A and 7B, an acoustic wave is excited. On the first main surface 6a of the piezoelectric layer 6, a reflector 8A is provided at one side of the first IDT electrode 7A and a reflector 8B is provided at the other side of the first IDT electrode 7A in an acoustic wave propagating direction. Similarly, on the second main surface 6b of the piezoelectric layer 6, a reflector 8C is provided at one side of the second IDT electrode 7B and a reflector 8D is provided at the other side of the second IDT electrode 7B in the acoustic wave propagating direction. The reflectors 8A, 8B, 8C, and 8D may be at the same potential as the first IDT electrode 7A or as the second IDT electrode 7B or as both of the first and second IDT electrodes 7A and 7B. The reflectors may alternatively be floating electrodes. The floating electrode is an electrode which is connected to neither of a signal potential nor a ground potential. As is seen from above, the first acoustic wave resonator in the first example embodiment is a surface acoustic wave resonator, for example.

As illustrated in FIG. 3, the first IDT electrode 7A includes a first busbar 16, a second busbar 17, multiple first electrode fingers 18, and multiple second electrode fingers 19. The first and second busbars 16 and 17 face each other. One end of each of the multiple first electrode fingers 18 is connected to the first busbar 16. One end of each of the multiple second electrode fingers 19 is connected to the second busbar 17. The first electrode fingers 18 and the second electrode fingers 19 are interdigitated with each other.

As in the first IDT electrode 7A, the second IDT electrode 7B also includes a pair of busbars and multiple electrode fingers. The first IDT electrode 7A and the second IDT electrode 7B have the same or substantially the same electrode finger pitch. The electrode finger pitch is a center-to-center distance between adjacent electrode fingers. More specifically, the electrode finger pitch is a center-to-center distance between adjacent electrode fingers which are connected to different potentials. In the specification, having the same electrode finger pitch includes the meaning that the electrode finger pitch is different within a range of errors which does not influence the electrical characteristics of the acoustic wave resonators.

In the first IDT electrode 7A, as seen from the acoustic wave propagating direction, a region where adjacent electrode fingers overlap each other is an interdigital region A. Similarly, the second IDT electrode 7B also includes an interdigital region. The interdigital region A of the first IDT electrode 7A and the interdigital region of the second IDT electrode 7B match each other in a plan view. More specifically, in a plan view, the centers of the multiple electrode fingers in the interdigital region A of the first IDT electrode 7A match those in the interdigital region of the second IDT electrode 7B. This includes the meaning that at least some of the electrode fingers of the first IDT electrode 7A and at least some of the electrode fingers of the second IDT electrode 7B match each other in a plan view. That is, the electrode fingers of the first IDT electrode 7A and those of the second IDT electrode 7B substantially match each other within a range of errors which does not influence the electrical characteristics of the acoustic wave resonators. Certain misalignment of the electrode fingers due to the manufacturing variations can be ignored and it can still be said that the electrode fingers match each other. "In a plan view" is a direction in which the acoustic wave resonator is seen from above, that is, from the top portion in FIG. 2.

In the first example embodiment, the electrode fingers which match each other in a plan view are at the same potential. Nevertheless, the relationship between the potential of the electrode fingers of the first IDT electrode 7A and that of the electrode fingers of the second IDT electrode 7B is not limited to this configuration. For example, at least one of multiple pairs of electrode fingers which match each other in a plan view may be at the same potential.

Figure 4:
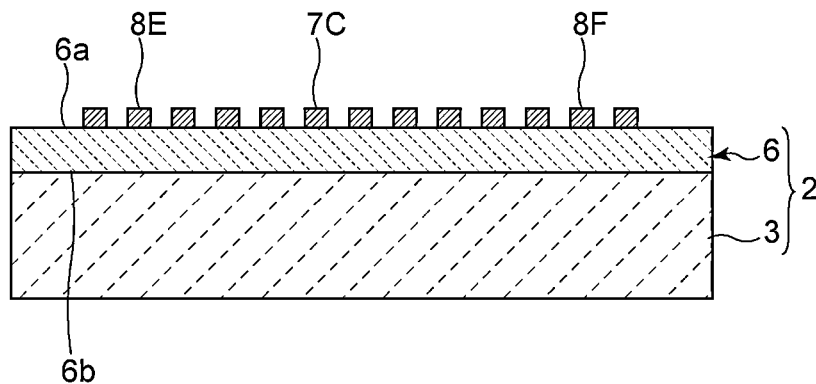
FIG. 4 is an elevational cross-sectional view of a second acoustic wave resonator in the first example embodiment of the present invention.

FIG. 4 is an elevational cross-sectional view of the second acoustic wave resonator in the first example embodiment.

The second acoustic wave resonator includes a piezoelectric substrate 2. The piezoelectric layer of the piezoelectric substrate in the second acoustic wave resonator of the present example embodiment includes third and fourth main surfaces. In the first example embodiment, the second acoustic wave resonator uses the piezoelectric substrate 2 of the first acoustic wave resonator. Accordingly, the third main surface and the first main surface 6a are the same main surface, while the fourth main surface and the second main surface 6b are the same main surface.

A third IDT electrode 7C is provided on the first main surface 6a of the piezoelectric layer 6. As in the above-described first IDT electrode 7A, the third IDT electrode 7C includes a pair of busbars and multiple electrode fingers. On the first main surface 6a, a reflector 8E is provided at one side of the third IDT electrode 7C and a reflector 8F is provided at the other side of the third IDT electrode 7C in the acoustic wave propagating direction. The reflectors 8E and 8F may be at the same potential as the third IDT electrode 7C or may be floating electrodes. As seen from above, the second acoustic wave resonator in the first example embodiment is a surface acoustic wave resonator, for example. The IDT electrodes and the reflectors of the first and second acoustic wave resonators may each be defined by a single-layer metal film or a multilayer metal film. A protection film, such as a silicon oxide film, for example, may be provided on the first main surface 6a to cover the third IDT electrode 7C.

In the filter device 1, all of the acoustic wave resonators use the same piezoelectric substrate 2. Alternatively, for example, each acoustic wave resonator may include its own piezoelectric substrate. Hereinafter, the first IDT electrode 7A, the second IDT electrode 7B, and the third IDT electrode 7C may simply be called IDT electrodes collectively. In each IDT electrode in the first example embodiment, the acoustic wave propagating direction and the extending direction of the multiple electrode fingers are perpendicular or substantially perpendicular to each other.

A unique feature of the filter device 1 of the first example embodiment is that the filter device 1 includes both of the first and second acoustic wave resonators. In the first acoustic wave resonator, the first IDT electrode 7A is disposed on the first main surface 6a of the piezoelectric layer 6, while the second IDT electrode 7B is disposed on the second main surface 6b. This can decrease the area of the piezoelectric layer 6 required for disposing IDT electrodes, thus improving the miniaturization of the entire filter device 1. The filter device 1 includes, not only the first acoustic wave resonator, but also the second acoustic wave resonator. In the second acoustic wave resonator, the third IDT electrode 7C is provided only on the first main surface 6a of the piezoelectric layer 6. With this configuration, when electric power is applied to the filter device 1, a local stress applied to the piezoelectric layer 6 in a portion provided with the second acoustic wave resonator can be reduced. This can reduce or prevent the degradation of the filter characteristics. More specifically, it is possible to reduce or prevent the degradation of IMD characteristics and harmonic wave characteristics, for example.

Additionally, in the second acoustic wave resonator, a functional electrode to which an AC voltage is applied is only the third IDT electrode 7C disposed on the first main surface 6a of the piezoelectric layer 6. It is thus possible to regulate a local temperature rise in a portion provided with the second acoustic wave resonator, thus improving the electric power handling capability.

In one example, the number of pairs of electrode fingers of the third IDT electrode 7C in the second acoustic wave resonator may be greater than that of each of the first and second IDT electrodes 7A and 7B in the first acoustic wave resonator. In this case, the longitudinal mode resonance can be regulated, thus reducing or preventing the degradation of the filter characteristics more reliably. Additionally, the electrostatic capacitance can be increased also in the second acoustic wave resonator. In another example, the interdigital width of the third IDT electrode 7C in the second acoustic wave resonator may be wider than that of each of the first and second IDT electrodes 7A and 7B in the first acoustic wave resonator. The interdigital width is a dimension of the interdigital region in the extending direction of the electrode fingers. In this case, the transverse mode resonance can be regulated, thus reducing or preventing the degradation of the filter characteristics more reliably. Additionally, the electrostatic capacitance can be increased also in the second acoustic wave resonator. If the area of the second IDT electrode 7B is reduced, the miniaturization of the filter device 1 can be further enhanced.

As in the first example embodiment, it is preferable that each of the series arm resonators in the filter device 1 be the first acoustic wave resonator. This can reduce or prevent the degradation of the filter characteristics more reliably. This will be explained more specifically. If the center position of each of the electrode fingers of the first IDT electrode 7A and that of the second IDT electrode 7B are different from each other in a plan view, the occurrence of a ripple may be observed in the frequency characteristics. The ripple occurs in a frequency region higher than the anti-resonant frequency. In a series arm resonator, the anti-resonant frequency is usually positioned outside a pass band. Even with the occurrence of a ripple, its influence can be small, which makes it less likely to degrade the filter characteristics. The center position of an electrode finger is the center position of the electrode finger in the acoustic wave propagating direction.

It is preferable that each of the parallel arm resonators in the filter device 1 be the second acoustic wave resonator. This can reduce or prevent the degradation of the filter characteristics more reliably. This will be explained more specifically. In a parallel arm resonator, the anti-resonant frequency is usually positioned within a pass band. Unlike the first acoustic wave resonator, a ripple described above is unlikely to occur in the second acoustic wave resonator, which makes it less likely to degrade the filter characteristics.

There may be a case in which at least one series arm resonator is the first acoustic wave resonator. There may be another case in which at least one parallel arm resonator is the second acoustic wave resonator. Even in these cases, the degradation of the filter characteristics can be reduced or prevented with higher reliability.

The configuration of the first example embodiment will be described below in greater detail.

As illustrated in FIG. 1, the plural series arm resonators in the first example embodiment are series arm resonators S1, S2, S3, S4, and S5, while the plural parallel arm resonators in the first example embodiment are parallel arm resonators P1, P2, P3, and P4. The series arm resonators S1, S2, S3, S4, and S5 are connected in series with each other between the first signal terminal 4 and the second signal terminal 5.

The parallel arm resonator P1 is connected between a ground potential and a node between the series arm resonators S1 and S2. The parallel arm resonator P2 is connected between a ground potential and a node between the series arm resonators S2 and S3. The parallel arm resonator P3 is connected between a ground potential and a node between the series arm resonators S3 and S4. The parallel arm resonator P4 is connected between a ground potential and a node between the series arm resonators S4 and S5.

The circuit configuration of the filter device 1 is not restricted to the above-described configuration. The filter device 1 may include at least one series arm resonator and at least one parallel arm resonator. A filter device according to an example embodiment of the present invention may include a longitudinally coupled resonator acoustic wave filter and this longitudinally coupled resonator acoustic wave filter may determine a pass band.

As shown in FIG. 2, in the first example embodiment, the second IDT electrode 7B of the first acoustic wave resonator is embedded in the support substrate 3. This can enhance the electrochemical migration resistance. This can also enhance the heat dissipation characteristics and further improve the electric power handling capability. The moisture resistance is also improved.

Examples of the material for the piezoelectric layer 6 are lithium niobate, lithium tantalate, zinc oxide, aluminum nitride, quartz, and PZT (lead zirconate titanate). It is preferable, however, that lithium niobate or lithium tantalate be used as the material for the piezoelectric layer 6.

When the wavelength determined by the electrode finger pitch of the IDT electrode is represented by λ, the thickness of the piezoelectric layer 6 is preferably 1λ or smaller, regardless of whether the electrode finger pitch of the first IDT electrode 7A, the second IDT electrode 7B, or the third IDT electrode 7C is used as a base for determining the wavelength. This can suitably excite an acoustic wave. Specifically, the wavelength λ is expressed by λ=2p, where p is the electrode finger pitch.

In the first example embodiment, silicon is used for the support substrate 3. However, the material for the support substrate 3 is not limited to silicon, and another material, such as glass, quartz, or alumina, may be used. The configuration of the piezoelectric substrate 2 in the first example embodiment is only an example, and the piezoelectric substrate 2 is not limited to a multilayer substrate of the support substrate 3 and the piezoelectric layer 6.

Figure 5:
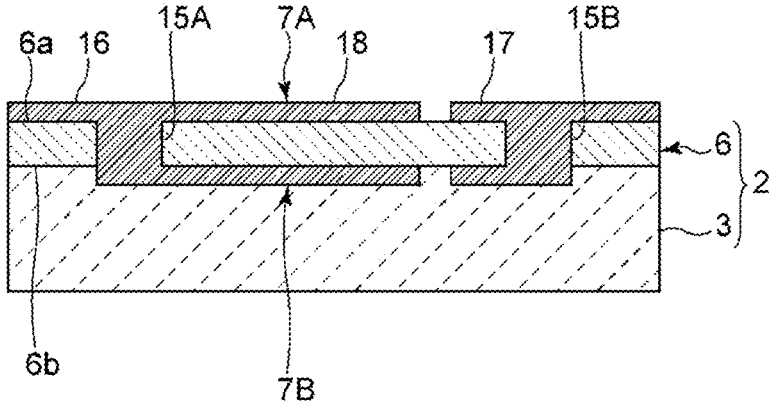
FIG. 5 is a sectional view taken along line II-II in FIG. 3.

FIG. 5 is a sectional view taken along line II-II in FIG. 3.

The first acoustic wave resonator includes a first through-electrode 15A and a second through-electrode 15B. The first and second through-electrodes 15A and 15B pass through the piezoelectric layer 6. The first through-electrode 15A connects the first busbar 16 of the first IDT electrode 7A and one busbar of the second IDT electrode 7B with each other. The second through-electrode 15B connects the second busbar 17 of the first IDT electrode 7A and the other busbar of the second IDT electrode 7B with each other. With this configuration, the potential of the electrode fingers facing each other with the piezoelectric layer 6 interposed therebetween becomes the same. Instead of the first and second through-electrodes 15A and 15B, wiring may be used to connect the corresponding busbars so that the potential of the electrode fingers facing each other becomes the same.

Figure 6:
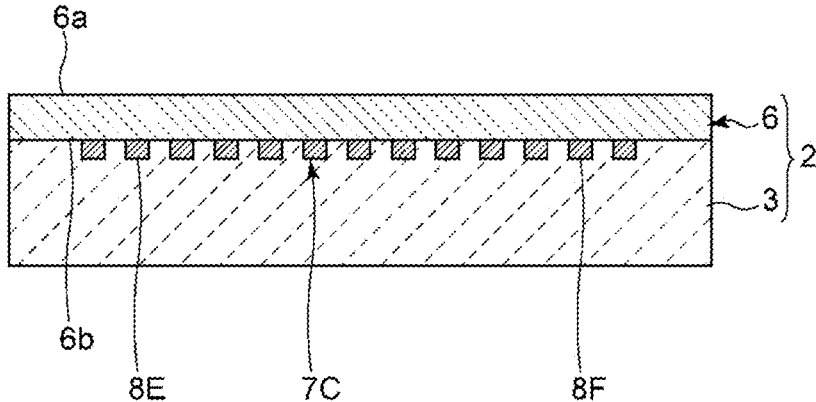
FIG. 6 is an elevational cross-sectional view of the second acoustic wave resonator in a modified example of the first example embodiment of the present invention.

Regarding the second acoustic wave resonator, in the first example embodiment, the third IDT electrode 7C is provided only on the first main surface 6a of the piezoelectric layer 6, as shown in FIG. 4. However, the arrangement of the third IDT electrode 7C is not limited to this configuration. In a modified example of the first example embodiment illustrated in FIG. 6, the third IDT electrode 7C of the second acoustic wave resonator is provided only on the second main surface 6b of the piezoelectric layer 6. The third IDT electrode 7C is embedded in the support substrate 3. This can enhance the electrochemical migration resistance. This can also enhance the heat dissipation characteristics and further improve the electric power handling capability. The moisture resistance can also be improved.

In a filter device according to an example embodiment of the present invention, the third IDT electrodes 7C of all the second acoustic wave resonators may be disposed only on the second main surface 6b. Alternatively, the third IDT electrodes 7C of some of the second acoustic wave resonators may be disposed only on the first main surface 6a, and the third IDT electrodes 7C of the remaining second acoustic wave resonators may be disposed on the second main surface 6b. In these cases, too, as in the first example embodiment, the miniaturization of the filter device can be enhanced and the degradation of the filter characteristics can be reduced or prevented. A protection film, such as a silicon oxide film, may be provided on the second main surface 6b to cover the third IDT electrodes 7C.

Second through twelfth example embodiments, which are different from the first example embodiment only in the arrangement of the first and second acoustic wave resonators, will be described below. As well as in the first example embodiment, in the second through twelfth example embodiments, the miniaturization of the filter device can be enhanced and the degradation of the filter characteristics can be reduced or prevented. The circuit configuration and the configurations of the first and second acoustic wave resonators in the second through twelfth example embodiments are similar to those of the first example embodiment. The filter devices of the second through twelfth example embodiments will thus be discussed with reference to the drawings used for explaining the first example embodiment. Note that, in some of the second through twelfth example embodiments, points to be focused are merely different from those of the first example embodiment and, essentially, such example embodiments may be encompassed in the first example embodiment. In the second acoustic wave resonator in each of the following example embodiments, the third IDT electrode 7C may be provided only on the first main surface 6a of the piezoelectric layer 6 or only on the second main surface 6b thereof.

In the second example embodiment, at least one parallel arm resonator is the first acoustic wave resonator, while at least one series arm resonator is the second acoustic wave resonator.

In a series arm resonator, the resonant frequency is usually positioned within a pass band. This increases the influence of the longitudinal mode and the transverse mode on the filter characteristics. To address this issue, in one example, the number of pairs of electrode fingers of the third IDT electrode 7C in the second acoustic wave resonator may be set to be greater than that of each of the first and second IDT electrodes 7A and 7B in the first acoustic wave resonator. In this case, the longitudinal mode resonance can be regulated, thus reducing or preventing the degradation of the filter characteristics more reliably. In another example, the interdigital width of the third IDT electrode 7C in the second acoustic wave resonator may be set to be wider than that of each of the first and second IDT electrodes 7A and 7B in the first acoustic wave resonator. In this case, the transverse mode resonance can be regulated, thus reducing or preventing the degradation of the filter characteristics more reliably.

In a parallel arm resonator, the resonant frequency is usually positioned outside a pass band. Accordingly, even though the parallel arm resonators are first acoustic wave resonators, the influence of the longitudinal mode and the transverse mode is small, which makes it less likely to degrade the filter characteristics.

In the third example embodiment, at least one of the acoustic wave resonators with an electrostatic capacitance higher than the average electrostatic capacitance of all the acoustic wave resonators is the second acoustic wave resonator. This second acoustic wave resonator is a series arm resonator.

In the specification, it is assumed that, between the second acoustic wave resonators, as the product of the number of pairs of electrode fingers and the interdigital width of a second acoustic wave resonator is larger, the electrostatic capacitance of this second acoustic wave resonator is higher. The same also applies to the first acoustic wave resonators. If, between the first and second acoustic wave resonators, the electrostatic capacitance of the first acoustic wave resonator and that of the second acoustic wave resonator are the same, the product of the number of pairs of electrode fingers and the interdigital width in the second acoustic wave resonator is larger than that in the first acoustic wave resonator.

The product of the number of pairs of electrode fingers and the interdigital width in the second acoustic wave resonator with an electrostatic capacitance higher than the average electrostatic capacitance of all the acoustic wave resonators is thus larger than the average product of the number of pairs of electrode fingers and the interdigital width in all the acoustic wave resonators. That is, at least one of the configuration in which the number of pairs of electrode fingers in the above-described second acoustic wave resonator is greater than the average number of pairs of electrode fingers in all the acoustic wave resonators and the configuration in which the interdigital width of this second acoustic wave resonator is greater than the average interdigital width of all the acoustic wave resonators is provided. Hence, in this acoustic wave resonator, the longitudinal mode resonance or the transverse mode resonance can be regulated, thus reducing or preventing the degradation of the filter characteristics more reliably.

The value obtained by dividing the electrostatic capacitance of a series arm resonator by that of a parallel arm resonator is set to be a capacitance ratio. Since the above-described second acoustic wave resonator is a series arm resonator, the capacitance ratio can be made larger. This can reduce the insertion loss in the filter device 1.

In the fourth example embodiment, at least one of the acoustic wave resonators with an electrostatic capacitance higher than the average electrostatic capacitance of all the acoustic wave resonators is the second acoustic wave resonator. This second acoustic wave resonator is a parallel arm resonator.

In the fourth example embodiment, as well as in the third example embodiment, the longitudinal mode resonance and the transverse mode resonance can be regulated. It is thus possible to reduce the degradation of the filter characteristics more reliably. Additionally, since this second acoustic wave resonator is a parallel arm resonator, the capacitance ratio can be made smaller, thus increasing the attenuation outside the pass band.

In the fifth example embodiment, at least one of the acoustic wave resonators with an electrostatic capacitance higher than the average electrostatic capacitance of all the acoustic wave resonators is the first acoustic wave resonator. This first acoustic wave resonator is a series arm resonator.

In the first acoustic wave resonator, the IDT electrode is provided on both of the first and second main surfaces 6a and 6b of the piezoelectric layer 6. It is thus possible to raise the electrostatic capacitance and reduce the size of the first acoustic wave resonator, thus enhancing the miniaturization of the filter device 1 more reliably. Additionally, since the above-described first acoustic wave resonator is a series arm resonator, the capacitance ratio can be made larger. This can reduce the insertion loss in the filter device 1.

In the sixth example embodiment, at least one of the acoustic wave resonators with an electrostatic capacitance higher than the average electrostatic capacitance of all the acoustic wave resonators is the first acoustic wave resonator. This first acoustic wave resonator is a parallel arm resonator.

In the sixth example embodiment, as well as in the fifth example embodiment, the miniaturization of the filter device 1 can be enhanced more reliably. Additionally, since this first acoustic wave resonator is a parallel arm resonator, the capacitance ratio can be made smaller, thus increasing the attenuation outside the pass band.

In the seventh example embodiment, at least one of the acoustic wave resonators with an electrostatic capacitance lower than the average electrostatic capacitance of all the acoustic wave resonators is the second acoustic wave resonator. This second acoustic wave resonator is a series arm resonator.

As described above, as the product of the number of pairs of electrode fingers and the interdigital width is larger, the electrostatic capacitance is higher. Since the electrostatic capacitance of the above-described second acoustic wave resonator is lower than the average electrostatic capacitance, the area of the interdigital region is relatively small. The amount of heat generated in the interdigital region in the second acoustic wave resonator is smaller than that in the acoustic wave resonator of the first acoustic wave resonator. It is thus possible to regulate a local temperature rise more reliably, thus enhancing the electric power handling capability with higher reliability.

Additionally, since the above-described second acoustic wave resonator is a series arm resonator, the capacitance ratio can be made smaller, thus increasing the attenuation outside the pass band.

In the eighth example embodiment, at least one of the acoustic wave resonators with an electrostatic capacitance lower than the average electrostatic capacitance of all the acoustic wave resonators is the second acoustic wave resonator. This second acoustic wave resonator is a parallel arm resonator.

In the eighth example embodiment, as well as in the seventh example embodiment, it is possible to regulate a local temperature rise more reliably, thus enhancing the electric power handling capability with higher reliability. Additionally, since the above-described second acoustic wave resonator is a parallel arm resonator, the capacitance ratio can be made larger. This can reduce the insertion loss in the filter device 1.

In the ninth example embodiment, at least one of the acoustic wave resonators of the first and second stages from the first signal terminal 4 is the second acoustic wave resonator. The acoustic wave resonator of the first stage is an acoustic wave resonator connected to a signal terminal without having any series arm resonator therebetween. The acoustic wave resonator of the second stage is an acoustic wave resonator connected to a signal terminal with one series arm resonator interposed therebetween. The acoustic wave resonator of the n-th stage is an acoustic wave resonator connected to a signal terminal with the (n−1)-th series arm resonator interposed therebetween, where n is a natural number. As illustrated in FIG. 1, in the ninth example embodiment, the acoustic wave resonator of the first stage from the first signal terminal 4 is the series arm resonator S1, while the acoustic wave resonator of the second stage from the first signal terminal 4 is the series arm resonator S2 and the parallel arm resonator P1.

In the filter device 1, electric power is input from the first signal terminal 4. Hence, particularly in the acoustic wave resonators of the first and second stages from the first signal terminal 4, a large amount of power is consumed. In the ninth example embodiment, at least one of the acoustic wave resonators of the first and second stages from the first signal terminal 4 is the second acoustic wave resonator. This can effectively ease a local stress applied to the piezoelectric layer 6. It is thus possible to effectively reduce or prevent the degradation of the IMD characteristics and the harmonic wave characteristics, thus effectively reducing or preventing the degradation of the filter characteristics. Additionally, it is possible to effectively regulate a local temperature rise, thus effectively enhancing the electric power handling capability.

In the tenth example embodiment, at least one of the acoustic wave resonators of the first and second stages from the second signal terminal 5 is the second acoustic wave resonator. In the filter device 1, the second signal terminal 5 is the antenna terminal.

The acoustic wave resonators of the first and second stages from the antenna terminal are particularly likely to contribute to determining the IMD characteristics and the harmonic wave characteristics of the filter device 1. In the tenth example embodiment, at least one of the acoustic wave resonators of the first and second stages from the antenna terminal is the second acoustic wave resonator. This can effectively ease a local stress applied to the piezoelectric layer 6. It is thus possible to effectively reduce or prevent the degradation of the IMD characteristics and the harmonic wave characteristics, thus effectively reducing or preventing the degradation of the filter characteristics.

The filter device 1 may be a receive filter. In this case, too, the degradation of the filter characteristics of the filter device 1 corresponding to the ninth example embodiment and that corresponding to the tenth example embodiment can also be reduced or prevented.

In the eleventh example embodiment, among the series arm resonators, the series arm resonator including an IDT electrode with the narrowest electrode finger pitch is the second acoustic wave resonator.

Among the series arm resonators, the series arm resonator including an IDT electrode with the narrowest electrode finger pitch is most likely to determine the characteristics of the edge of the pass band on the higher frequency side. If the electric power handling capability of this series arm resonator is low, the filter characteristics are likely to deteriorate. In the eleventh example embodiment, this series arm resonator is the second acoustic wave resonator. It is thus possible to regulate a local temperature rise in a portion provided with this series arm resonator, thus enhancing the electric power handling capability more reliably. This can lead to the reduction or prevention of the degradation of the filter characteristics with higher reliability.

In the twelfth example embodiment, among the parallel arm resonators, the parallel arm resonator including an IDT electrode with the widest electrode finger pitch is the second acoustic wave resonator.

Among the parallel arm resonators, the parallel arm resonator including an IDT electrode with the widest electrode finger pitch is most likely to determine the character-istics of the edge of the pass band on the lower frequency side. If the electric power handling capability of this parallel arm resonator is low, the filter characteristics are likely to deteriorate. In the twelfth example embodiment, this parallel arm resonator is the second acoustic wave resonator. It is thus possible to regulate a local temperature rise in a portion provided with this parallel arm resonator, thus enhancing the electric power handling capability more reliably. This can lead to the reduction or prevention of the degradation of the filter characteristics with higher reliability.

Thirteenth through seventeenth example embodiments described below are different from the first example embodiment in the circuit configuration. The configurations of the first and second acoustic wave resonators in the thirteenth through seventeenth example embodiments are similar to those of the first example embodiment. The configurations of the first and second acoustic wave resonators will thus be explained with reference to the drawings used for explaining the first example embodiment. As well as in the first example embodiment, in the thirteenth through seventeenth example embodiments, the miniaturization of the filter device can be enhanced and the degradation of the filter characteristics can also be reduced or prevented.

Figure 7:
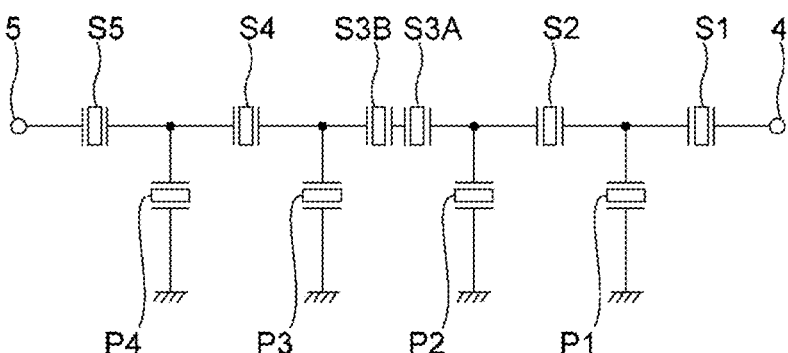
FIG. 7 is a circuit diagram of a filter device according to a thirteenth example embodiment of the present invention.

FIG. 7 is a circuit diagram of a filter device according to the thirteenth example embodiment.

In the thirteenth example embodiment, a series arm resonator with an electrostatic capacitance lower than the average electrostatic capacitance of all the acoustic wave resonators is divided in series. This series arm resonator divided in series is the first acoustic wave resonator. More specifically, as shown in FIG. 7, divided resonators S3A and S3B are connected in series with each other between the series arm resonators S2 and S4. As described above, the divided resonators S3A and S3B are resonators obtained by dividing the first acoustic wave resonator and are thus both first acoustic wave resonators.

In the first acoustic wave resonator, the IDT electrode is provided on both of the first and second main surfaces 6*a* and 6*b* of the piezoelectric layer 6. Moreover, the interdigital regions of the two IDT electrodes match each other in a plan view. The area of the interdigital region of the first acoustic wave resonator can thus be reduced. This makes it less likely to increase the area even though the first acoustic wave resonator is divided in series. Additionally, the first acoustic wave resonator from which the divided resonators S3A and S3B are obtained is a series arm resonator with an electro-static capacitance lower than the average electrostatic capacitance of all the acoustic wave resonators. As stated above, as the product of the number of pairs of electrode fingers and the interdigital width is larger, the electrostatic capacitance is higher. Since the electrostatic capacitance of the above-described first acoustic wave resonator is low, the area of the interdigital region of this first acoustic wave resonator is small. More specifically, the product of the number of pairs of electrode fingers and the interdigital width of this first acoustic wave resonator is smaller than the average product of the number of pairs of electrode fingers and the interdigital width of all the acoustic wave resonators. Accordingly, even though the first acoustic wave resonator is divided in series, the area is not likely to be increased. It is thus possible to enhance the miniaturization of the entire filter device with higher reliability.

Additionally, dividing a series arm resonator in series can decrease the capacitance ratio, which makes it possible to increase the attenuation outside the pass band. The above-described series arm resonator, which is the first acoustic wave resonator, may be divided in parallel. The first acoustic wave resonator is divided into two resonators in the thirteenth example embodiment. However, the first acoustic wave resonator may be divided into three or more resonators. Such a modification may be made if at least one of the series arm resonators with an electrostatic capacitance lower than the average electrostatic capacitance of all the acoustic wave resonators is the first acoustic wave resonator and is divided in series or in parallel.

Figure 8:
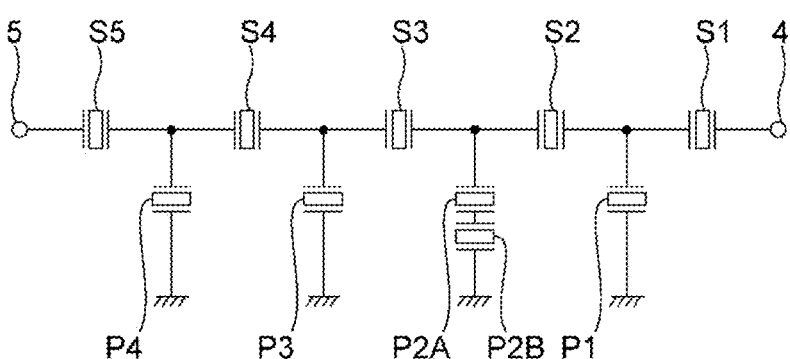
FIG. 8 is a circuit diagram of a filter device according to a fourteenth example embodiment of the present invention.

FIG. 8 is a circuit diagram of a filter device according to the fourteenth example embodiment.

In the fourteenth example embodiment, a parallel arm resonator with an electrostatic capacitance lower than the average electrostatic capacitance of all the acoustic wave resonators is divided in series. This parallel arm resonator divided in series is the first acoustic wave resonator. More specifically, as shown in FIG. 8, divided resonators P2A and P2B are connected in series with each other between a ground potential and a node between the series arm resonators S2 and S3. As described above, the divided resonators P2A and P2B are resonators obtained by dividing the first acoustic wave resonator and are thus both first acoustic wave resonators.

As discussed above, even though the first acoustic wave resonator is divided in series, the area is not likely to be large. Additionally, the first acoustic wave resonator from which the divided resonators P2A and P2B are obtained is a parallel arm resonator with an electrostatic capacitance lower than the average electrostatic capacitance of all the acoustic wave resonators. Since the electrostatic capacitance of the above-described first acoustic wave resonator is low, the area of the interdigital region of this first acoustic wave resonator is small. More specifically, the product of the number of pairs of electrode fingers and the interdigital width of this first acoustic wave resonator is smaller than the average product of the number of pairs of electrode fingers and the interdigital width of all the acoustic wave resonators. Accordingly, even though the first acoustic wave resonator is divided in series, the area is not likely to be increased. It is thus possible to enhance the miniaturization of the entire filter device with higher reliability.

Additionally, dividing a parallel arm resonator in series can increase the capacitance ratio, which makes it possible to reduce the insertion loss. The above-described parallel arm resonator, which is the first acoustic wave resonator, may be divided in parallel. The first acoustic wave resonator is divided into two resonators in the fourteenth example embodiment. However, the first acoustic wave resonator may be divided into three or more resonators. Such a modification may be made if at least one of the parallel arm resonators with an electrostatic capacitance lower than the average electrostatic capacitance of all the acoustic wave resonators is the first acoustic wave resonator and is divided in series or in parallel.

Figure 9:
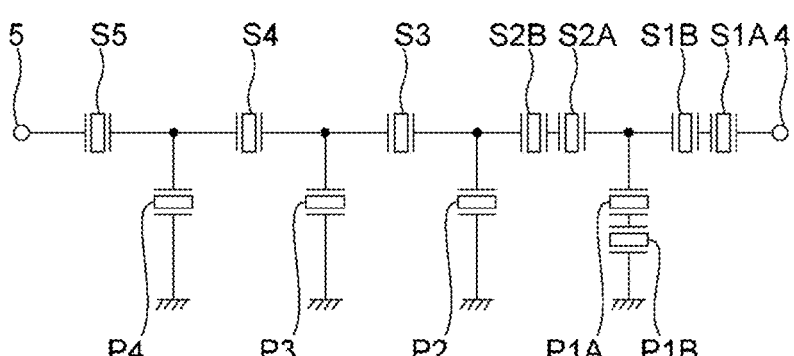
FIG. 9 is a circuit diagram of a filter device according to a fifteenth example embodiment of the present invention.

FIG. 9 is a circuit diagram of a filter device according to the fifteenth example embodiment.

In the fifteenth example embodiment, the acoustic wave resonators of the first and second stages from the first signal terminal 4 are each divided in series. These acoustic wave resonators divided in series are both the first acoustic wave resonator.

More specifically, divided resonators S1A, S1B, S2A, and S2B are connected in series with each other between the first signal terminal 4 and the series arm resonator S3. Divided resonators P1A and P1B are connected in series with each other between a ground potential and a node between the divided resonators S1B and S2A. The divided resonators S1A and S1B are resonators obtained by dividing the series arm resonator of the first stage from the first signal terminal 4. The divided resonators S2A and S2B are resonators obtained by dividing the series arm resonator of the second stage from the first signal terminal 4. The divided resonators P1A and P1B are resonators obtained by dividing the parallel arm resonator of the second stage from the first signal terminal 4.

As stated above, particularly in the acoustic wave resonators of the first and second stages from the first signal terminal 4, a large amount of power is consumed. In the fifteenth example embodiment, the acoustic wave resonators of the first and second stages from the first signal terminal 4 are each divided in series. This can diminish the amount of electric power applied to the electrode fingers of the IDT electrodes in each of the acoustic wave resonators, thus improving the electric power handling capability. Additionally, a local stress applied to the piezoelectric layer 6 can be eased. It is thus possible to reduce or prevent the degradation of the IMD characteristics and the harmonic wave characteristics, thus reducing or preventing the degradation of the filter characteristics.

The first acoustic wave resonators of the first and second stages from the first signal terminal 4 may be each divided in parallel. The first acoustic wave resonator is divided into two resonators in the fifteenth example embodiment. However, the first acoustic wave resonator may be divided into three or more resonators. Such a modification may be made if at least one of the acoustic wave resonators of the first and second stages from the first signal terminal 4 is the first acoustic wave resonator and is divided in series or in parallel.

Figure 10:
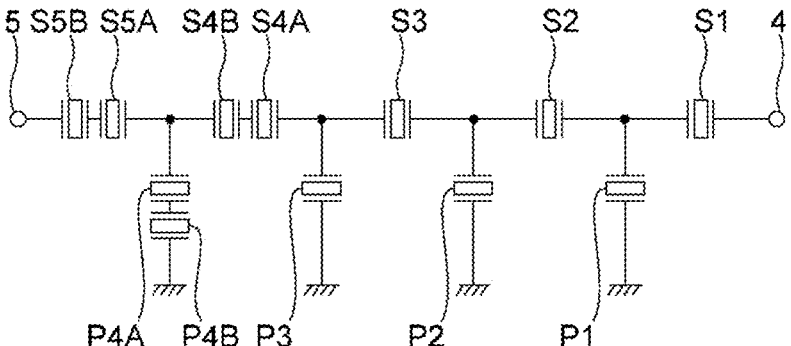
FIG. 10 is a circuit diagram of a filter device according to a sixteenth example embodiment of the present invention.

FIG. 10 is a circuit diagram of a filter device according to the sixteenth example embodiment.

In the sixteenth example embodiment, the acoustic wave resonators of the first and second stages from the second signal terminal 5 are each divided in series. These acoustic wave resonators divided in series are both the first acoustic wave resonator.

More specifically, divided resonators S4A, S4B, S5A, and S5B are connected in series with each other between the series arm resonator S3 and the second signal terminal 5. Divided resonators P4A and P4B are connected in series with each other between a ground potential and a node between the divided resonators S4B and S5A. The divided resonators S5A and S5B are resonators obtained by dividing the series arm resonator of the first stage from the second signal terminal 5. The divided resonators S4A and S4B are resonators obtained by dividing the series arm resonator of the second stage from the second signal terminal 5. The divided resonators P4A and P4B are resonators obtained by dividing the parallel arm resonator of the second stage from the second signal terminal 5.

The second signal terminal 5 is the antenna terminal. As stated above, the acoustic wave resonators of the first and second stages from the antenna terminal are particularly likely to contribute to determining the IMD characteristics and the harmonic wave characteristics of a filter device. In the sixteenth example embodiment, the acoustic wave resonators of the first and second stages from the antenna terminal are each divided in series. This can cancel IMD components each other out. This can also distribute harmonic waves so as to reduce the level of harmonic waves in the filter device. It is thus possible to reduce or prevent the degradation of the filter characteristics.

The first acoustic wave resonators of the first and second stages from the second signal terminal 5 may be each divided in parallel. The first acoustic wave resonator is divided into two resonators in the sixteenth example embodiment. However, the first acoustic wave resonator may be divided into three or more resonators. Such a modification may be made if at least one of the acoustic wave resonators of the first and second stages from the second signal terminal 5 is the first acoustic wave resonator and is divided in series or in parallel.

The circuit configuration and the configurations of the first and second acoustic wave resonators of the seventeenth example embodiment described below are similar to those of the thirteenth example embodiment shown in FIG. 7. The seventeenth example embodiment will thus be explained below by using FIG. 7.

In the seventeenth example embodiment, among the series arm resonators, the IDT electrodes of the divided resonators S3A and S3B have the narrowest electrode finger pitch. Accordingly, among the series arm resonators, the IDT electrode of the series arm resonator from which the divided resonators S3A and S3B are obtained has the narrowest electrode finger pitch. Each of the divided resonators S3A and S3B is the first acoustic wave resonator.

Among the series arm resonators, the series arm resonator including an IDT electrode with the narrowest electrode finger pitch is most likely to determine the characteristics of the edge of the pass band on the higher frequency side. If the electric power handling capability of this series arm resonator is low, the filter characteristics are likely to deteriorate. In the seventeenth example embodiment, this series arm resonator is the first acoustic wave resonator and is divided in series. It is thus possible to regulate a local temperature rise in a portion provided with the divided resonators, thus enhancing the electric power handling capability more reliably. The degradation of the filter characteristics can also be reduced or prevented with higher reliability.

The position of the series arm resonator from which the divided resonators S3A and S3B are obtained is not limited to that shown in FIG. 7.

The circuit configuration and the configurations of the first and second acoustic wave resonators of the eighteenth example embodiment described below are similar to those of the fourteenth example embodiment shown in FIG. 8. The eighteenth example embodiment will thus be explained below by using FIG. 8.

In the eighteenth example embodiment, among the parallel arm resonators, the IDT electrodes of the divided resonators P2A and P2B have the widest electrode finger pitch. Accordingly, among the parallel arm resonators, the IDT electrode of the parallel arm resonator from which the divided resonators P2A and P2B are obtained has the widest electrode finger pitch. Each of the divided resonators P2A and P2B is the first acoustic wave resonator.

Among the parallel arm resonators, the parallel arm resonator including an IDT electrode with the widest electrode finger pitch is most likely to determine the characteristics of the edge of the pass band on the lower frequency side. If the electric power handling capability of this parallel arm resonator is low, the filter characteristics are likely to deteriorate. In the eighteenth example embodiment, this parallel arm resonator is the first acoustic wave resonator and is divided in series. It is thus possible to regulate a local temperature rise in a portion provided with the divided resonators, thus enhancing the electric power handling capability more reliably. The degradation of the filter characteristics can also be reduced or prevented with higher reliability.

The position of the parallel arm resonator from which the divided resonators P2A and P2B are obtained is not limited to that shown in FIG. 8.

In the first through eighteenth example embodiments, the piezoelectric substrate 2 is a multilayer substrate of the support substrate 3 and the piezoelectric layer 6. However, the multilayer structure of the piezoelectric substrate 2 is not limited to this configuration. For example, the support substrate 3 may be a high acoustic velocity support substrate, which serves as a high acoustic velocity material layer. The high acoustic velocity material layer is a layer of a relatively high acoustic velocity. More specifically, the acoustic velocity of a bulk wave propagating through the high acoustic velocity material layer is higher than that of an acoustic wave propagating through the piezoelectric layer 6. In the piezoelectric substrate 2 configured as described above, the high acoustic velocity support substrate and the piezoelectric layer 6 are stacked on each other. With this configuration, acoustic wave energy can be trapped in the piezoelectric layer 6 effectively.

Examples of the material for the high acoustic velocity material layer are: piezoelectric materials, such as aluminum nitride, lithium tantalate, lithium niobate, and quartz; ceramic materials, such as alumina, sapphire, magnesia, silicon nitride, silicon carbide, zirconia, cordierite, mullite, steatite, forsterite, spinel, and sialon; dielectric materials, such as aluminum oxide, silicon oxynitride, DLC (diamond-like carbon), and diamond; semiconductor materials, such as silicon; and a material having any of the above-described materials as a principal component. The above-described spinel includes an aluminum compound containing oxygen and at least one of elements selected from Mg, Fe, Zn, and Mn, for example. Examples of the spinel are $MgAl_2O_4$, $FeAl_2O_4$, $ZnAl_2O_4$, and $MnAl_2O_4$. In the specification, the principal component is a component that makes up more than 50 wt % of the entire material. The above-described materials as the principal component may be in any one of the monocrystalline, polycrystalline, and amorphous states or a mixture of these states.

Filter devices of nineteenth through twenty-third example embodiments, which are different from the first example embodiment in the configuration of the piezoelectric substrate, will be described below. The nineteenth through twenty-third example embodiments are different from the first example embodiment also in that it includes a second acoustic wave resonator including a third IDT electrode on the first main surface of the piezoelectric layer and a second acoustic wave resonator including a third IDT electrode on the second main surface of the piezoelectric layer. Apart from these points, the configurations of the filter devices of the nineteenth through twenty-third example embodiments are similar to that of the filter device 1 of the first example embodiment. As well as in the first example embodiment, in the nineteenth through twenty-third example embodiments, the miniaturization of the filter devices can be enhanced and the degradation of the filter characteristics can also be reduced or prevented.

Figure 11:
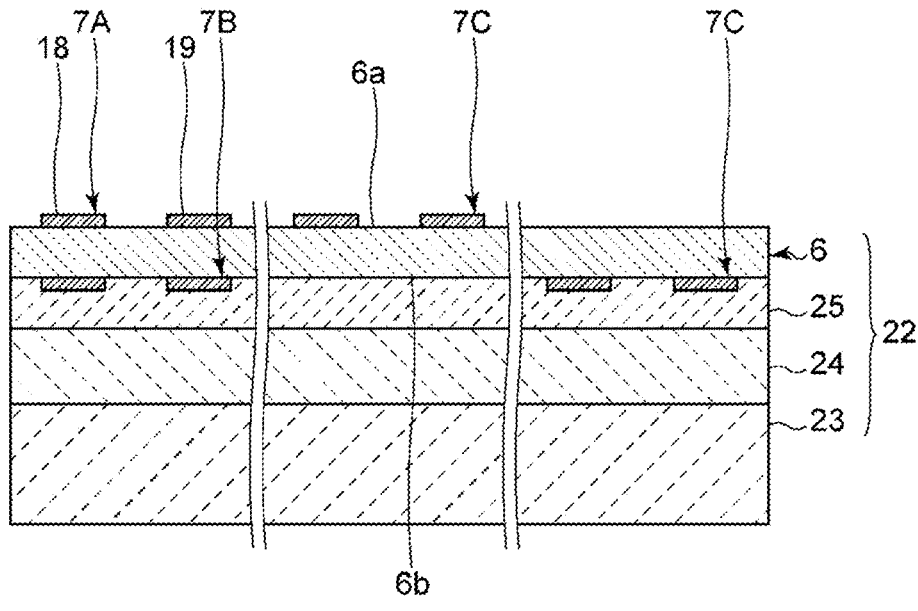
FIG. 11 is a schematic elevational cross-sectional view of four pairs of electrode fingers and the vicinity thereof in a nineteenth example embodiment of the present invention.
Figure 12:
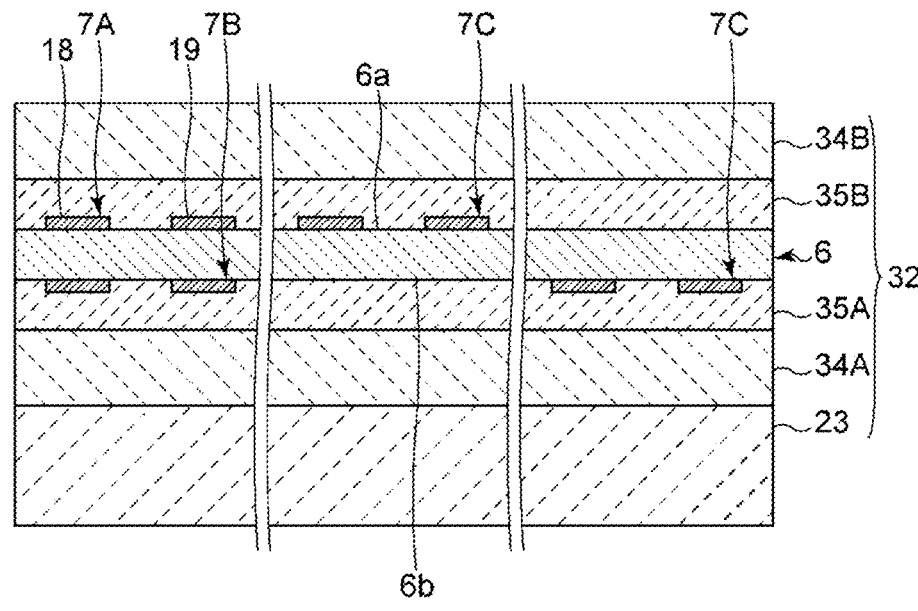
FIG. 12 is a schematic elevational cross-sectional view of four pairs of electrode fingers and the vicinity thereof in a twentieth example embodiment of the present invention.
Figure 16:
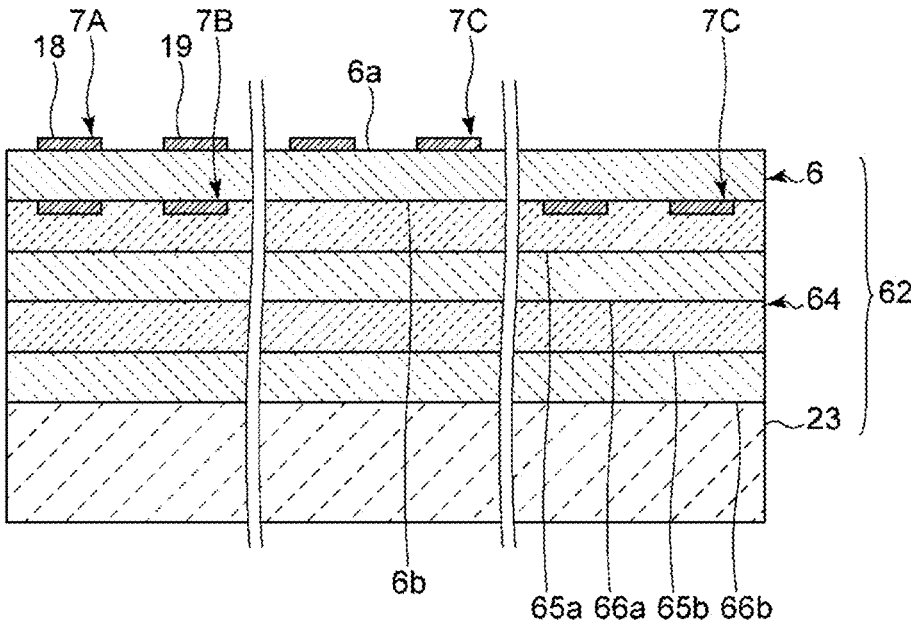
FIG. 16 is a schematic elevational cross-sectional view of four pairs of electrode fingers and the vicinity thereof in a twenty-third example embodiment of the present invention.
Figure 17:
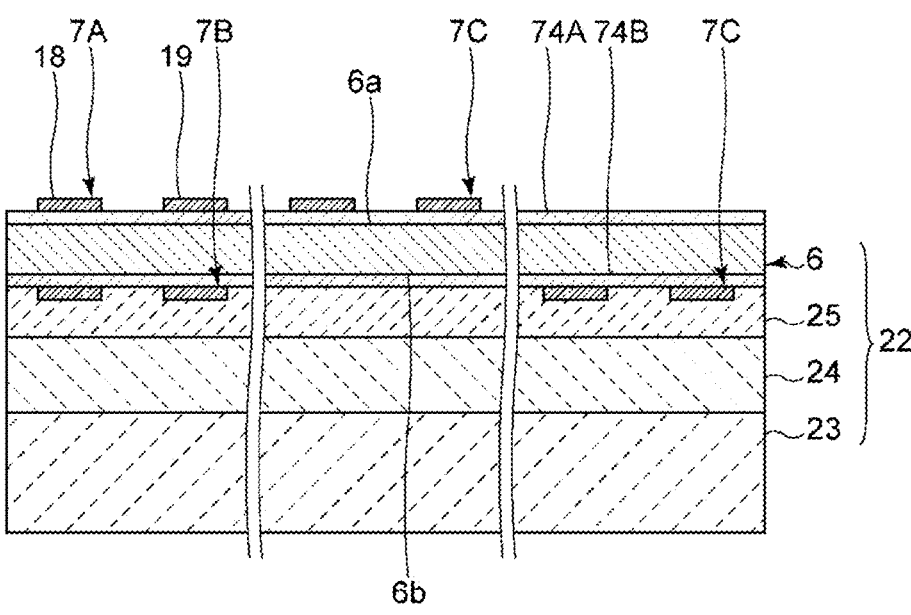
FIG. 17 is a schematic elevational cross-sectional view of four pairs of electrode fingers and the vicinity thereof in a twenty-fourth example embodiment of the present invention.

FIG. 11 is a schematic elevational cross-sectional view of four pairs of electrode fingers and the vicinity thereof in the nineteenth example embodiment. In FIG. 11, one first acoustic wave resonator and two second acoustic wave resonators are schematically shown side by side. The schematic elevational cross-sectional views of FIGS. 12, 16, and 17 are also illustrated similarly.

A piezoelectric substrate 22 includes a support substrate 23, a high acoustic velocity film 24, which serves as a high acoustic velocity material layer, a low acoustic velocity film 25, and a piezoelectric layer 6. More specifically, the high acoustic velocity film 24 is disposed on the support substrate 23, the low acoustic velocity film 25 is disposed on the high acoustic velocity film 24, and the piezoelectric layer 6 is disposed on the low acoustic velocity film 25.

The low acoustic velocity film 25 is a film of a relatively low acoustic velocity. More specifically, the acoustic velocity of a bulk wave propagating through the low acoustic velocity film 25 is lower than that of a bulk wave propagating through the piezoelectric layer 6. Examples of the material for the low acoustic velocity film 25 are glass, silicon oxide, silicon oxynitride, lithium oxide, tantalum pentoxide, and a material containing, as a principal component, a compound obtained by adding fluorine, carbon, or boron to silicon oxide.

Examples of the material for the support substrate 23 are: piezoelectric materials, such as aluminum oxide, lithium tantalate, lithium niobate, and quartz; various ceramic materials, such as alumina, sapphire, magnesia, silicon nitride, aluminum nitride, silicon carbide, zirconia, cordierite, mullite, steatite, and forsterite; dielectric materials, such as diamond and glass; and semiconductor and resin materials, such as silicon and gallium nitride.

In the piezoelectric substrate 22, the high acoustic velocity film 24, the low acoustic velocity film 25, and the piezoelectric layer 6 are stacked on each other in this order. With this configuration, acoustic wave energy can be trapped in the piezoelectric layer 6 effectively.

First through third modified examples of the piezoelectric substrate 22 will be described below. With the use of such piezoelectric substrates, too, acoustic wave energy can be trapped in the piezoelectric layer 6 effectively. The piezoelectric substrate of the first modified example is a multilayer substrate of the above-described high acoustic velocity support substrate, the low acoustic velocity film 25, and the piezoelectric layer 6. The piezoelectric substrate of the second modified example is a multilayer substrate of the support substrate 23, the high acoustic velocity film 24, and the piezoelectric layer 6. The piezoelectric substrate of the third modified example is a multilayer substrate of the high acoustic velocity support substrate and the piezoelectric layer 6, which has been discussed above as an example.

FIG. 12 is a schematic elevational cross-sectional view of four pairs of electrode fingers and the vicinity thereof in the twentieth example embodiment.

A piezoelectric substrate 32 includes a support substrate 23, a first high acoustic velocity film 34A, a first low acoustic velocity film 35A, a piezoelectric layer 6, a second high acoustic velocity film 34B, and a second low acoustic velocity film 35B. The piezoelectric substrate 32 will be explained more specifically. The first high acoustic velocity film 34A is disposed on the support substrate 23. The first low acoustic velocity film 35A is disposed on the first high acoustic velocity film 34A. The piezoelectric layer 6 is disposed on the first low acoustic velocity film 35A. The second low acoustic velocity film 35B is disposed on the piezoelectric layer 6. The second high acoustic velocity film 34B is disposed on the second low acoustic velocity film 35B. The first high acoustic velocity film 34A corresponds to the high acoustic velocity film 24 in the nineteenth example embodiment. The first low acoustic velocity film 35A corresponds to the low acoustic velocity film 25 in the nineteenth example embodiment. The piezoelectric substrate 32 corresponds to a multilayer substrate in which the second low acoustic velocity film 35B is disposed on the piezoelectric layer 6 of the piezoelectric substrate 22 in the nineteenth example embodiment and the second high acoustic velocity film 34B is disposed on the second low acoustic velocity film 35B. In the twentieth example embodiment, too, acoustic wave energy can be trapped in the piezoelectric layer 6 effectively.

Examples of other multilayer structures of the piezoelectric substrate will be discussed below. In these examples, too, acoustic wave energy can be trapped in the piezoelectric layer 6 effectively. The piezoelectric substrate may be a multilayer substrate having the piezoelectric substrate 22 and the second low acoustic velocity film 35B or a multilayer substrate having the piezoelectric substrate 22 and the second high acoustic velocity film 34B. Alternatively, the piezoelectric substrate may be a multilayer substrate of the piezoelectric substrate of the first, second, or third modified example of the piezoelectric substrate 22, the second low acoustic velocity film 35B, and the second high acoustic velocity film 34B. Alternatively, the piezoelectric substrate may be a multilayer substrate of the piezoelectric substrate of the first, second, or third modified example of the piezoelectric substrate 22 and the second low acoustic velocity film 35B or may be a multilayer substrate of the piezoelectric substrate of the first, second, or third modified example of the piezoelectric substrate 22 and the second high acoustic velocity film 34B.

Figure 13:
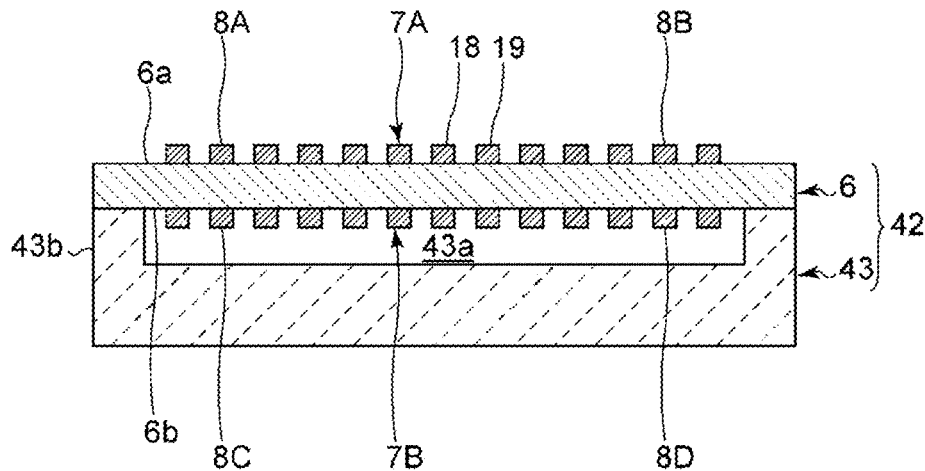
FIG. 13 is an elevational cross-sectional view of the first acoustic wave resonator in a twenty-first example embodiment of the present invention.

FIG. 13 is an elevational cross-sectional view of the first acoustic wave resonator in the twenty-first example embodiment.

A piezoelectric substrate 42 is a multilayer substrate of a support substrate 43 and a piezoelectric layer 6. The support substrate 43 has a recessed portion 43a and a support portion 43b. The support portion 43b encloses the recessed portion 43a. The piezoelectric layer 6 is provided on the support portion 43b so as to cover the recessed portion 43a. In the twenty-first example embodiment, a hollow section includes the recessed portion 43a.

The individual acoustic wave resonators in the twenty-first example embodiment use the same piezoelectric substrate 42, though such a state is not shown. Accordingly, the first and second acoustic wave resonators use the same piezoelectric substrate 42. Plural acoustic wave resonators may use the same recessed portion 43a. The support portion 43b may be disposed between plural acoustic wave resonators. In a plan view, each of the first IDT electrode 7A, the second IDT electrode 7B, and the third IDT electrode 7C at least partially overlaps the recessed portion 43a, which defines and functions as a hollow section.

A protection film may be provided on at least one of the first and second main surfaces 6a and 6b of the piezoelectric layer 6 so as to cover the IDT electrodes. Alternatively, a dielectric film may be provided on at least one of the first and second main surfaces 6a and 6b of the piezoelectric layer 6. The IDT electrodes may be embedded in this dielectric film.

Figure 14:
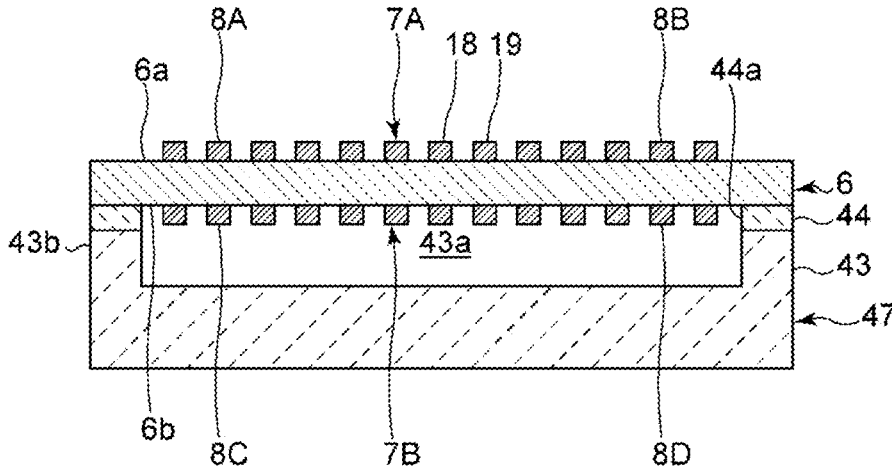
FIG. 14 is an elevational cross-sectional view of the first acoustic wave resonator in a modified example of the twenty-first example embodiment of the present invention.

In the twenty-first example embodiment and the above-described other example embodiments, the support preferably is a support substrate. However, the configuration of the support is not limited to the above-described configuration. For example, in a modified example of the twenty-first example embodiment shown in FIG. 14, a support 47 includes a support substrate 43 and a bonding layer 44. More specifically, the bonding layer 44 is provided on the support substrate 43, and the piezoelectric layer 6 is provided on the bonding layer 44. The bonding layer 44 bonds the support substrate 43 and the piezoelectric layer 6 with each other. The bonding layer 44 preferably is frame-shaped. More specifically, the bonding layer 44 has a through-hole 44a. In this modified example, the hollow section includes the recessed portion 43a of the support substrate 43 and the through-hole 44a of the bonding layer 44. As in the twenty-first example embodiment, in the modified example, too, the miniaturization of the filter device can be enhanced and the degradation of the filter characteristics can also be reduced or prevented. A recessed portion may be provided in the bonding layer 44 and may form a hollow section. In this case, the provision of the recessed portion 43a in the support substrate 43 may be omitted.

Figure 15:
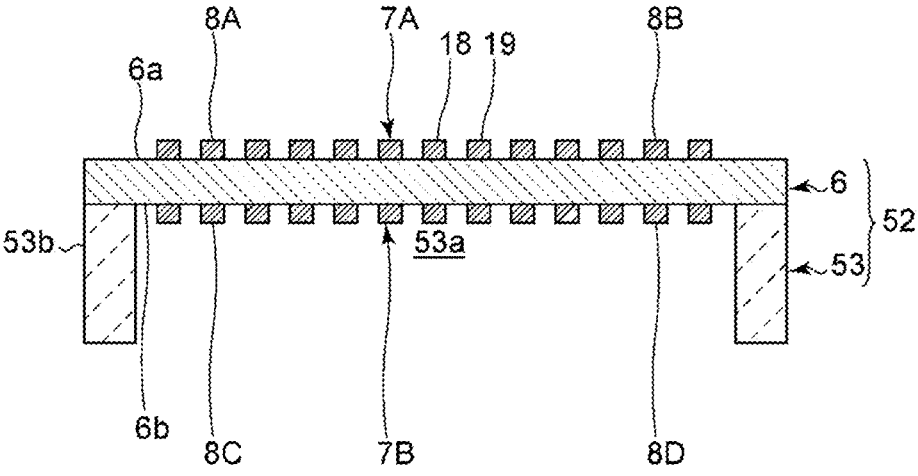
FIG. 15 is an elevational cross-sectional view of the first acoustic wave resonator in a twenty-second example embodiment of the present invention.

FIG. 15 is an elevational cross-sectional view of the first acoustic wave resonator in the twenty-second example embodiment.

A piezoelectric substrate 52 is a multilayer substrate of a support substrate 53 and a piezoelectric layer 6. The support substrate 53 has a through-hole 53a and a support portion 53b. The support portion 53b encloses the through-hole 53a. The piezoelectric layer 6 is provided on the support portion 53b so as to cover one open end of the through-hole 53a. In the twenty-second example embodiment, a hollow section includes the through-hole 53a.

The individual acoustic wave resonators in the twenty-second example embodiment use the same piezoelectric substrate 52, though such a state is not shown. Accordingly, the first and second acoustic wave resonators use the same piezoelectric substrate 52. Plural acoustic wave resonators may use the same through-hole 53a. The support portion 53b may be disposed between plural acoustic wave resonators.

A protection film may be provided on at least one of the first and second main surfaces 6a and 6b of the piezoelectric layer 6 so as to cover the IDT electrodes. Alternatively, a dielectric film may be provided on at least one of the first and second main surfaces 6a and 6b of the piezoelectric layer 6. The IDT electrodes may be embedded in this dielectric film.

The multilayer structure of the piezoelectric substrate 52 is not limited to the above-described structure. For example, the bonding layer 44 shown in FIG. 14 may be provided between the support substrate 53 and the piezoelectric layer 6. In this case, the hollow section includes the through-hole 53a of the support substrate 53 and the through-hole 44a of the bonding layer 44.

FIG. 16 is a schematic elevational cross-sectional view of four pairs of electrode fingers and the vicinity thereof in the twenty-third example embodiment.

A piezoelectric substrate 62 includes a support substrate 23, an acoustic reflective film 64, and a piezoelectric layer 6. More specifically, the acoustic reflective film 64 is disposed on the support substrate 23, and the piezoelectric layer 6 is disposed on the acoustic reflective film 64.

The acoustic reflective film 64 is a multilayer body of multiple acoustic impedance layers. More specifically, the acoustic reflective film 64 includes plural low acoustic impedance layers and plural high acoustic impedance layers. The low acoustic impedance layer is a layer having a relatively low acoustic impedance. The plural low acoustic impedance layers of the acoustic reflective film 64 are low acoustic impedance layers 65a and 65b. The high acoustic impedance layer is a layer having a relatively high acoustic impedance. The plural high acoustic impedance layers of the acoustic reflective film 64 are high acoustic impedance layers 66a and 66b. The low acoustic impedance layers and the high acoustic impedance layers are alternately stacked on each other. The low acoustic impedance layer 65a is closer to the piezoelectric layer 6 than the other layers of the acoustic reflective film 64. The IDT electrodes provided on the second main surface 6b of the piezoelectric layer 6 are embedded in the low acoustic impedance layer 65a.

The acoustic reflective film 64 includes two low acoustic impedance layers and two high acoustic impedance layers.

However, the acoustic reflective film 64 may include at least one low acoustic impedance layer and at least one high acoustic impedance layer.

As the material for the low acoustic impedance layer, silicon oxide or aluminum, for example, may be used. As the material for the high acoustic impedance layer, a metal, such as platinum or tungsten, or a dielectric material, such as aluminum nitride or silicon nitride, may be used.

A protection film may be provided on the first main surface 6a of the piezoelectric layer 6 so as to cover the IDT electrodes. Alternatively, a dielectric film may be provided on the first main surface 6a. The IDT electrodes may be embedded in this dielectric film.

FIG. 17 is a schematic elevational cross-sectional view of four pairs of electrode fingers and the vicinity thereof in a twenty-fourth example embodiment.

The twenty-fourth example embodiment is different from the nineteenth example embodiment shown in FIG. 11 in that a dielectric film, which defines and functions as a fractional-bandwidth adjusting film, is provided on each of the first and second main surfaces 6a and 6b of the piezoelectric layer 6 such that it overlaps the IDT electrodes in a plan view. Apart from this point, the configuration of the filter device of the twenty-fourth example embodiment is similar to that of the filter device of the nineteenth example embodiment. In the twenty-fourth example embodiment, too, the third main surface and the first main surface 6a are the same main surface, while the fourth main surface and the second main surface 6b are the same main surface.

The twenty-fourth example embodiment will be explained below more specifically. A fractional-bandwidth adjusting film 74A is provided between the first main surface 6a of the piezoelectric layer 6 and the first and third IDT electrodes 7A and 7C. The fractional-bandwidth adjusting film 74A is provided on the first main surface 6a such that it overlaps the third IDT electrode 7C disposed on the second main surface 6b in a plan view. A fractional-bandwidth adjusting film 74B is provided between the second main surface 6b and the second and third IDT electrodes 7B and 7C. The fractional-bandwidth adjusting film 74B is provided on the second main surface 6b such that it overlaps the third IDT electrode 7C disposed on the first main surface 6a in a plan view. Adjusting the thicknesses of the fractional-bandwidth adjusting films 74A and 74B can easily control the fractional bandwidth. The thickness of the fractional-bandwidth adjusting film 74A may differ between the individual acoustic wave resonators. Likewise, the thickness of the fractional-bandwidth adjusting film 74B may differ between the individual acoustic wave resonators.

As the material for the fractional-bandwidth adjusting films 74A and 74B, a suitable dielectric material can be used. As the material for the fractional-bandwidth adjusting films 74A and 74B, silicon oxide is preferably used. In this case, the frequency-temperature characteristics (TCF) can be improved and the electric power handling capability can be enhanced effectively.

A fractional-bandwidth adjusting film may be provided on at least one of the first and second main surfaces 6a and 6b of the piezoelectric layer 6 such that it overlaps at least one of the first IDT electrode 7A, the second IDT electrode 7B, and the third IDT electrode 7C in a plan view. In this case, too, the fractional bandwidth can be adjusted easily.

As in the nineteenth example embodiment, in the twenty-fourth example embodiment, the miniaturization of the filter device can be enhanced and the degradation of the filter characteristics can also be reduced or prevented.

The piezoelectric substrate 22 of the twenty-fourth example embodiment is configured similarly to that of the nineteenth example embodiment. However, the multilayer structure of the piezoelectric substrate may be configured similarly to that of the piezoelectric substrate in one of the above-described example embodiments, modified examples, and examples.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a plurality of acoustic wave resonators including first and second acoustic wave resonators each including:
   at least one first acoustic wave resonator including a piezoelectric substrate and first and second IDT electrodes, the piezoelectric substrate including a piezoelectric layer with first and second main surfaces facing each other, the first IDT electrode being located on the first main surface, the second IDT electrode being located on the second main surface and facing the first IDT electrode; and
   at least one second acoustic wave resonator including a piezoelectric substrate and a third IDT electrode, the piezoelectric substrate of the at least one second acoustic wave resonator including a piezoelectric layer with third and fourth main surfaces facing each other, the third IDT electrode being located on one of the third and fourth main surfaces; wherein
   each of the first, second, and third IDT electrodes includes at least one pair of electrode fingers, and a number of the at least one pair of electrode fingers of the third IDT electrode is greater than a number of the at least one pair of electrode fingers of each of the first and second IDT electrodes.

2. The filter device according to claim 1, wherein the first and second acoustic wave resonators include the same piezoelectric substrate, the first main surface and the third main surface are an identical main surface, and the second main surface and the fourth main surface are an identical main surface.

3. The filter device according to claim 1, wherein the filter device includes a plurality of acoustic wave resonators; and
   the filter device is a ladder filter including at least one series arm resonator and at least one parallel arm resonator.

4. The filter device according to claim 3, wherein at least one of the at least one series arm resonator is the first acoustic wave resonator.

5. The filter device according to claim 3, wherein at least one of the at least one parallel arm resonator is the second acoustic wave resonator.

6. The filter device according to claim 3, wherein at least one of the at least one parallel arm resonator is the first acoustic wave resonator.

7. The filter device according to claim 3, wherein at least one of the at least one series arm resonator is the second acoustic wave resonator.

8. The filter device according to claim 3, wherein at least one of the acoustic wave resonators with an electrostatic capacitance higher than an average electrostatic capacitance of all the acoustic wave resonators is the second acoustic wave resonator, the second acoustic wave resonator being the series arm resonator.

9. The filter device according to claim 3, wherein at least one of the acoustic wave resonators with an electrostatic capacitance higher than an average electrostatic capacitance of all the acoustic wave resonators is the second acoustic wave resonator, the second acoustic wave resonator being the parallel arm resonator.

10. The filter device according to claim 3, wherein at least one of the acoustic wave resonators with an electrostatic capacitance higher than an average electrostatic capacitance of all the acoustic wave resonators is the first acoustic wave resonator, the first acoustic wave resonator being the parallel arm resonator.

11. The filter device according to claim 3, wherein at least one of the acoustic wave resonators with an electrostatic capacitance higher than an average electrostatic capacitance of all the acoustic wave resonators is the first acoustic wave resonator, the first acoustic wave resonator being the series arm resonator.

12. The filter device according to claim 3, wherein at least one of the acoustic wave resonators with an electrostatic capacitance lower than an average electrostatic capacitance of all the acoustic wave resonators is the second acoustic wave resonator, the second acoustic wave resonator being the series arm resonator.

13. The filter device according to claim 3, wherein at least one of the acoustic wave resonators with an electrostatic capacitance lower than an average electrostatic capacitance of all the acoustic wave resonators is the second acoustic wave resonator, the second acoustic wave resonator being the parallel arm resonator.

14. The filter device according to claim 3, wherein at least one of the acoustic wave resonators with an electrostatic capacitance lower than an average electrostatic capacitance of all the acoustic wave resonators is the first acoustic wave resonator, the first acoustic wave resonator being the series arm resonator and being divided in series or in parallel.

15. The filter device according to claim 3, wherein at least one of the acoustic wave resonators with an electrostatic capacitance lower than an average electrostatic capacitance of all the acoustic wave resonators is the first acoustic wave resonator, the first acoustic wave resonator being the parallel arm resonator and being divided in series or in parallel.

16. The filter device according to claim 3, further comprising:
   an input terminal and an antenna terminal; wherein
   a plurality of the series arm resonators are between the input terminal and the antenna terminal;
   the plurality of the series arm resonators and the at least one parallel arm resonator are the acoustic wave resonators; and
   at least one of the acoustic wave resonators of first and second stages from the input terminal is the second acoustic wave resonator.

17. The filter device according to claim 3, further comprising:
   an input terminal and an antenna terminal; wherein
   a plurality of the series arm resonators are between the input terminal and the antenna terminal;
   the plurality of the series arm resonators and the at least one parallel arm resonator are the acoustic wave resonators; and
   at least one of the acoustic wave resonators of first and second stages from the antenna terminal is the second acoustic wave resonator.

18. The filter device according to claim 3, further comprising:
   an input terminal and an antenna terminal; wherein a plurality of the series arm resonators are between the input terminal and the antenna terminal;

the plurality of the series arm resonators and the at least one parallel arm resonator are the acoustic wave resonators; and at least one of the acoustic wave resonators of first and second stages from the input terminal is the first acoustic wave resonator.

19. The filter device according to claim 3, further comprising:

an input terminal and an antenna terminal; wherein a plurality of the series arm resonators are between the input terminal and the antenna terminal;

the plurality of the series arm resonators and the at least one parallel arm resonator are the acoustic wave resonators; and at least one of the acoustic wave resonators of first and second stages from the antenna terminal is the first acoustic wave resonator.

20. The filter device according to claim 3, wherein the at least one series arm resonator includes an IDT electrode, the IDT electrode being one of the first IDT electrode, the second IDT electrode, and the third IDT electrode; and among the at least one series arm resonator, a series arm resonator including an IDT electrode with a narrowest electrode finger pitch is the second acoustic wave resonator.

21. The filter device according to claim 3, wherein the at least one parallel arm resonator includes an IDT electrode, the IDT electrode being one of the first IDT electrode, the second IDT electrode, and the third IDT electrode; and among the at least one parallel arm resonator, a parallel arm resonator including an IDT electrode with a widest electrode finger pitch is the second acoustic wave resonator.

22. The filter device according to claim 3, wherein the at least one series arm resonator includes an IDT electrode, the IDT electrode being one of the first IDT electrode, the second IDT electrode, and the third IDT electrode; and among the at least one series arm resonator, a series arm resonator including an IDT electrode with a narrowest electrode finger pitch is the first acoustic wave resonator, the first acoustic wave resonator being divided in series or in parallel.

23. The filter device according to claim 3, wherein the at least one parallel arm resonator includes an IDT electrode, the IDT electrode being one of the first IDT electrode, the second IDT electrode, and the third IDT electrode; and among the at least one parallel arm resonator, a parallel arm resonator including an IDT electrode with a widest electrode finger pitch is the first acoustic wave resonator, the first acoustic wave resonator being divided in series or in parallel.

24. The filter device according to claim 1, wherein the third IDT electrode of at least one of the at least one second acoustic wave resonator is on the fourth main surface of the piezoelectric layer.

25. The filter device according to claim 1, further comprising:

a dielectric film on at least one of the first and second main surfaces of the piezoelectric layer of the first acoustic wave resonator and the third and fourth main surfaces of the piezoelectric layer of the second acoustic wave resonator such that the dielectric film overlaps at least one of the first IDT electrode, the second IDT electrode, and the third IDT electrode in a plan view.

26. The filter device according to claim 25, wherein the dielectric film includes silicon oxide.

27. The filter device according to claim 1, wherein the piezoelectric substrate includes a high acoustic velocity material layer, the piezoelectric layer being located on the high acoustic velocity material layer; and an acoustic velocity of a bulk wave propagating through the high acoustic velocity material layer is higher than an acoustic velocity of an acoustic wave propagating through the piezoelectric layer.

28. The filter device according to claim 27, wherein the piezoelectric substrate includes a low acoustic velocity film between the high acoustic velocity material layer and the piezoelectric layer; and an acoustic velocity of a bulk wave propagating through the low acoustic velocity film is lower than an acoustic velocity of a bulk wave propagating through the piezoelectric layer.

29. The filter device according to claim 28, wherein the low acoustic velocity film includes silicon oxide.

30. The filter device according to claim 27, wherein the piezoelectric substrate includes a support substrate; and the high acoustic velocity material layer is a high acoustic velocity film, the high acoustic velocity film being located on the support substrate.

31. The filter device according to claim 30, wherein the high acoustic velocity film includes silicon nitride.

32. The filter device according to claim 1, wherein each of the first IDT electrode and the second IDT electrode includes a plurality of electrode fingers;

at least some of the plurality of electrode fingers of the first IDT electrode and at least some of the plurality of electrode fingers of the second IDT electrode match each other in a plan view;

at least one pair of a plurality of pairs of the electrode fingers which match each other in a plan view are at an identical potential; and the piezoelectric substrate includes a support substrate, the piezoelectric layer being located directly on the support substrate, the second IDT electrode being embedded in the support substrate.

33. The filter device according to claim 1, wherein the piezoelectric substrate includes a support including a support substrate, the piezoelectric layer being located on the support; and a hollow section is in the support, each of the first IDT electrode, the second IDT electrode, and the third IDT electrode at least partially overlapping the hollow section in a plan view.

34. The filter device according to claim 30, wherein the support substrate includes silicon.

35. The filter device according to claim 1, wherein the piezoelectric substrate includes an acoustic reflective film, the piezoelectric layer being located on the acoustic reflective film; and the acoustic reflective film includes at least one low acoustic impedance layer and at least one high acoustic impedance layer, the at least one low acoustic impedance layer having a relatively low acoustic impedance, the at least one high acoustic impedance layer having a relatively high acoustic impedance, the at least one low acoustic impedance layer and the at least one high acoustic impedance layer being alternately stacked on each other.

36. The filter device according to claim 1, wherein each of the first IDT electrode and the second IDT electrode includes a pair of busbars, the filter device further comprising:

a through-electrode that passes through the piezoelectric layer and that connects one of the busbars of the first IDT electrode and one of the busbars of the second IDT electrode with each other.

37. The filter device according to claim 1, wherein the piezoelectric layer includes one of lithium niobate or lithium tantalate.

38. A filter device comprising:

a plurality of acoustic wave resonators including first and second acoustic wave resonators each including:

at least one first acoustic wave resonator including a piezoelectric substrate and first and second IDT electrodes, the piezoelectric substrate including a piezoelectric layer with first and second main surfaces facing each other, the first IDT electrode being located on the first main surface, the second IDT electrode being located on the second main surface and facing the first IDT electrode; and at least one second acoustic wave resonator including a piezoelectric substrate and a third IDT electrode, the piezoelectric substrate of the at least one second acoustic wave resonator including a piezoelectric layer with third and fourth main surfaces facing each other, the third IDT electrode being located on one of the third and fourth main surfaces; wherein when it is assumed that $\lambda$ is a wavelength determined by an electrode finger pitch of an IDT electrode, a thickness of the piezoelectric layer is about $1\lambda$ or smaller, regardless of whether the electrode finger pitch of the first IDT electrode, the second IDT electrode, or the third IDT electrode is used to determine the wavelength.

39. A filter device comprising:

a plurality of acoustic wave resonators including first and second acoustic wave resonators each including:

at least one first acoustic wave resonator including a piezoelectric substrate and first and second IDT electrodes, the piezoelectric substrate including a piezoelectric layer with first and second main surfaces facing each other, the first IDT electrode being located on the first main surface, the second IDT electrode being located on the second main surface and facing the first IDT electrode; and at least one second acoustic wave resonator including a piezoelectric substrate and a third IDT electrode, the piezoelectric substrate of the at least one second acoustic wave resonator including a piezoelectric layer with third and fourth main surfaces facing each other, the third IDT electrode being located on one of the third and fourth main surfaces; wherein each of the first, second, and third IDT electrodes includes at least one pair of electrode fingers that are interdigitated with each other, and an interdigital width of the third IDT electrode is wider than an interdigital width of each of the first and second IDT electrodes.

* * * * *